US007463490B2

(12) United States Patent
Kim et al.

(10) Patent No.: US 7,463,490 B2
(45) Date of Patent: Dec. 9, 2008

(54) PLASMA DISPLAY APPARATUS

(75) Inventors: Ki-Jung Kim, Suwon-si (KR); Myoung-Kon Kim, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 11/328,704

(22) Filed: Jan. 10, 2006

(65) Prior Publication Data
US 2006/0152896 A1 Jul. 13, 2006

(30) Foreign Application Priority Data
Jan. 11, 2005 (KR) ............... 10-2005-0002429

(51) Int. Cl.
*H05K 5/00* (2006.01)
(52) U.S. Cl. ................. 361/752; 361/681
(58) Field of Classification Search ........... 349/58–60, 349/67, 16; 361/681, 752; 359/819, 811
See application file for complete search history.

(56) References Cited

U.S. PATENT DOCUMENTS

| 4,083,616 | A | * | 4/1978 | McNiece et al. | 439/157 |
| 5,450,221 | A | * | 9/1995 | Owen et al. | 349/58 |
| 5,738,020 | A | * | 4/1998 | Correia | 109/51 |
| 5,831,816 | A | * | 11/1998 | Johns et al. | 361/681 |
| 5,946,062 | A | * | 8/1999 | Hasegawa et al. | 349/58 |
| 5,969,941 | A | * | 10/1999 | Cho | 361/687 |
| 6,008,870 | A | * | 12/1999 | Yun | 349/58 |
| 6,104,451 | A | * | 8/2000 | Matsuoka et al. | 349/58 |
| 6,144,552 | A | * | 11/2000 | Whitcher et al. | 361/681 |
| 6,151,207 | A | * | 11/2000 | Kim | 361/681 |
| 6,256,075 | B1 | * | 7/2001 | Yang | 348/843 |
| 6,272,022 | B1 | * | 8/2001 | Ferranti et al. | 361/818 |
| 6,392,723 | B1 | * | 5/2002 | Sugiyama et al. | 349/58 |
| 6,404,624 | B1 | * | 6/2002 | Jeong | 361/683 |
| 6,744,186 | B2 | * | 6/2004 | Oishi et al. | 313/46 |
| 6,894,739 | B2 | * | 5/2005 | Sung et al. | 349/58 |
| 6,966,617 | B2 | * | 11/2005 | Chen et al. | 312/7.2 |
| 2007/0052100 | A1 | * | 3/2007 | Bellinger | 257/758 |

* cited by examiner

*Primary Examiner*—Hung S Bui
(74) *Attorney, Agent, or Firm*—Knobbe Martens Olson & Bear LLP

(57) ABSTRACT

A plasma display apparatus is disclosed. In one embodiment, the apparatus includes i) a plasma display panel displaying images, ii) a chassis base disposed on a rear portion of the plasma display panel, iii) a circuit unit disposed on a rear portion of the chassis base to drive the plasma display panel, and iv) at least one reinforcing member coupled to a rear surface of the chassis base. In addition, one of the chassis base and the reinforcing member includes two or more aligning recesses that are separated from each other, and the other includes aligning protrusions to be inserted into the aligning recesses. According to one embodiment of the invention, the reinforcing members can be located exactly and coupled rapidly to the chassis base.

12 Claims, 6 Drawing Sheets

PLASMA DISPLAY APPARATUS

CROSS-REFERENCE TO RELATED PATENT APPLICATIONS

This application claims the benefit of Korean Patent Application No. 10-2005-0002429, filed on Jan. 11, 2005, in the Korean Intellectual Property Office, the disclosure of which is incorporated herein in its entirety by reference.

BACKGROUND OF THE INVENTION

1. Field of the Invention

The present invention relates to a plasma display apparatus, and more particularly, to a plasma display apparatus having an improved structure for exactly positioning and coupling a reinforcing member onto a chassis base.

2. Description of the Related Technology

Plasma display apparatuses are flat panel displays displaying images using a gas discharge, and are considered to be the next generation of flat panel displays that can replace cathode ray tubes due to high display properties such as display capacity, brightness, contrast, residual image, and viewing angle.

In general, the plasma display apparatus includes a plasma display panel, a chassis base disposed parallel to the plasma display panel, a circuit board mounted on a rear portion of the chassis base to drive the plasma display panel, and a case accommodating the plasma display panel, the chassis base, and the circuit board.

The chassis base, coupled to and supporting the plasma display panel, dissipates heat generated by the panel. However, when a thinner chassis base is used to manufacture a thinner plasma display apparatus, twisting or bending of the chassis base may occur. Therefore, in order to prevent the chassis from being deformed, reinforcing members are coupled to a rear surface of the chassis base by screws. The reinforcing members are required to be coupled to the chassis base at exact locations in order not to interfere with some circuit unit elements, which are disposed at the rear portion of the chassis base.

However, it takes a significant amount of time to locate the reinforcing member at the exact position and couple it to the chassis base. In addition, if the reinforcing member is not disposed and coupled precisely, the coupling operation is required to be performed again, causing fabrication costs to increase.

SUMMARY OF CERTAIN INVENTIVE ASPECTS

On aspect of the present invention provides a plasma display apparatus including an aligning member between a reinforcing member and a chassis base so that the reinforcing member can be rapidly aligned at an exact position and coupled to the chassis base.

Another aspect of the present invention provides a plasma display apparatus including: i) a plasma display panel displaying images, ii) a chassis base disposed on a rear portion of the plasma display panel, iii) a circuit unit disposed on a rear portion of the chassis base to drive the plasma display panel, and iv) at least one reinforcing member coupled to a rear surface of the chassis base, wherein one of the chassis base and the reinforcing member includes two or more aligning recesses that are separated from each other, and the other includes aligning protrusions to be inserted into the aligning recesses.

BRIEF DESCRIPTION OF THE DRAWINGS

Embodiments of the present invention will be described with reference to the attached drawings.

DETAILED DESCRIPTION OF CERTAIN INVENTIVE EMBODIMENTS

Figure 1:
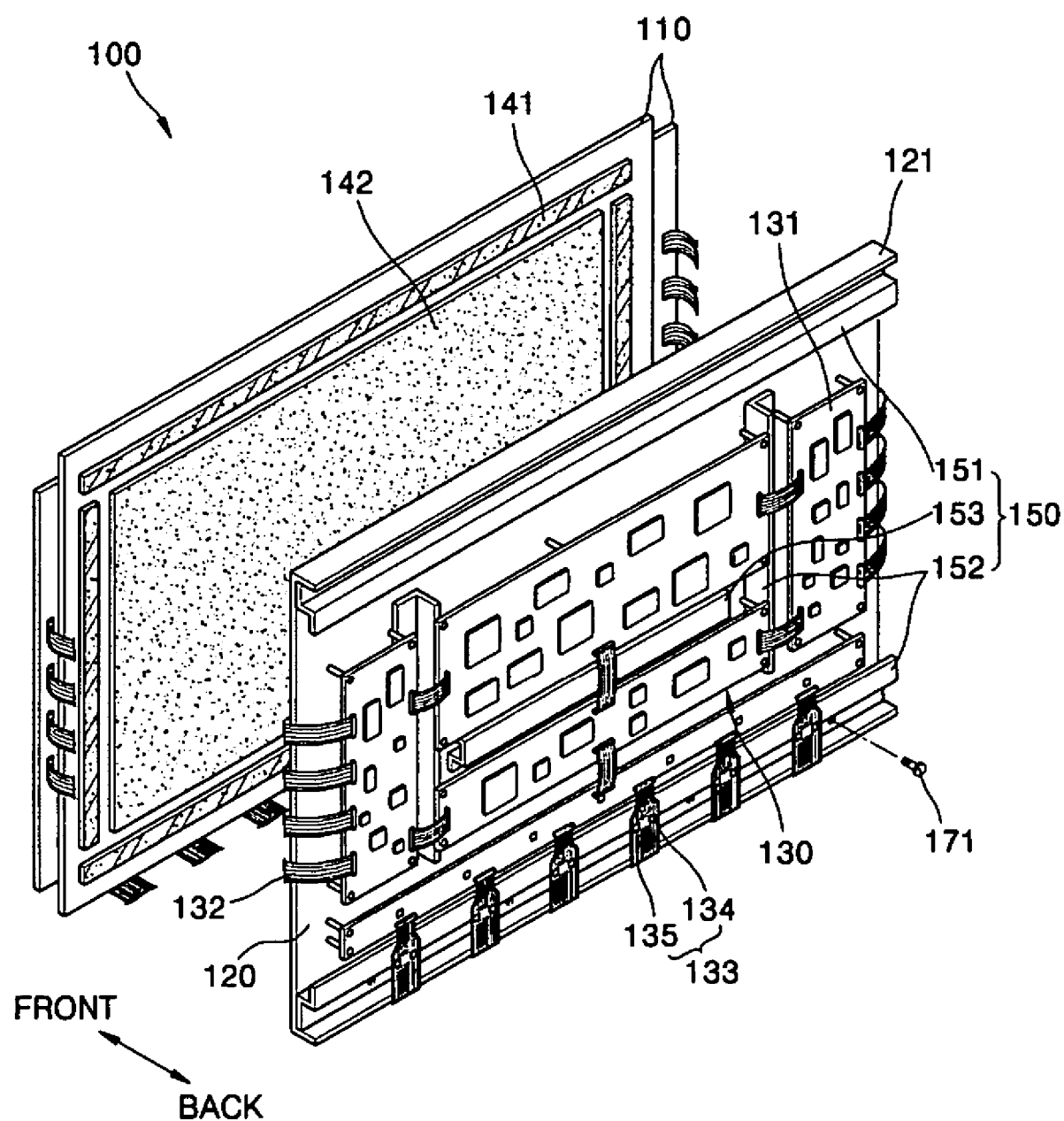
FIG. 1 is an exploded perspective view of a plasma display apparatus according to one embodiment of the present invention.

FIG. 1 is an exploded perspective view of a plasma display apparatus according to an embodiment of the present invention.

Referring to FIG. 1, the plasma display apparatus 100 includes a plasma display panel 110. The plasma display panel 110 displays images using a gas discharge, and can be one of various kinds of plasma display panels, for example, an alternating current (AC) plasma display panel having a surface-discharge three-electrode structure.

The AC plasma display panel having the surface discharge three-electrode structure includes a front panel and a rear panel coupled to the front panel.

In one embodiment, the front panel includes i) a front substrate disposed on a front portion, sustain electrode pairs formed on a rear surface of the front substrate, each pair including a common electrode and a scan electrode, ii) a front dielectric layer formed to cover the sustain electrode pairs, and iii) a protective layer formed on a rear surface of the front dielectric layer. In one embodiment, the rear panel coupled to the front panel includes: i) a rear substrate formed on a rear portion, ii) address electrodes formed on a front surface of the rear substrate and extending in a direction crossing the sustain electrode pairs, iii) a rear dielectric layer covering the address electrodes, iv) barrier ribs formed on a front surface of the rear dielectric layer to define discharge spaces, v) and a phosphor layer disposed in the discharge spaces. Here, the discharge spaces correspond to areas where the sustain electrode pairs and the address electrodes cross each other, and a discharge gas is filled in the discharge spaces.

A chassis base 120 is disposed on a rear portion of the plasma display panel 110 having the above structure. In one embodiment, the chassis base 120 is formed of aluminum, supports the plasma display panel 110, and dissipates heat generated by the plasma display panel 110 to the outside. To prevent bending of the chassis base 120, bending portions 121 are formed at edges thereof.

In one embodiment, the chassis base 120 is coupled to the plasma display panel 110 by an adhesive member 141 such as a dual-adhesive tape. A thermal conductive medium 142 is disposed between the chassis base 120 and the plasma display panel 110 to dissipate the heat generated from the plasma display panel 110 to the outside.

In addition, a circuit unit 130 is disposed on a rear portion of the chassis base 120 to drive the plasma display panel 110, and the circuit unit 130 is accommodated in a case (not shown) along with the plasma display panel 110 and the chassis base 120, thereby completing the assembling of the plasma display apparatus 100.

The circuit unit 130 can include a plurality of printed circuit boards 131 that are electrically connected to each other. Various electronic elements are installed on the printed circuit boards 131 for driving the plasma display panel 110. The electronic elements include an element for supplying power to the plasma display panel 110, an element for applying signals to form an image on the plasma display panel 110, etc. The electric signals generated at the circuit unit 130 are transmitted to the plasma display panel 110 by signal transmission members 132 and 133. In one embodiment, the signal transmission members can be a flexible printed cable (FPC), a tape carrier package (TCP), and a chip on film (COF).

In one embodiment, as shown in FIG. 1, the signal transmission members (FPCs) 132 are arranged on left and right sides of the chassis base 120 and connected to the circuit board 130. The signal transmission members (TCPs) 133 are arranged on a lower portion of the chassis base 120 and connected to the circuit board 130 In one embodiment, each of the TCPs 133 is formed as a package after mounting at least a device 134, for example, a driving integrated circuit (IC) on a wiring unit 135 of tape shape. However, these are merely examples, and the signal transmission members are not limited to the above structures.

A plurality of reinforcing members 150 can be disposed on a rear portion of the chassis base 120 where the circuit unit 130 is formed. In one embodiment, the reinforcing members 150 are formed of a rigid material such as metal and coupled to the rear surface of the chassis base 120 to increase a heat dissipation area of the chassis base 120. Thus, the heat dissipation efficiency can be improved, and bending or curving of the chassis base 120 can be significantly reduced or prevented.

Figure 2A:
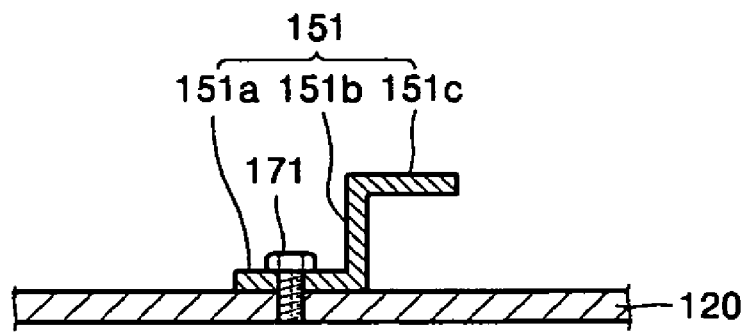
FIGS. 2A through 2C are cross-sectional views of reinforcing members shown in FIG. 1.
Figure 2B:
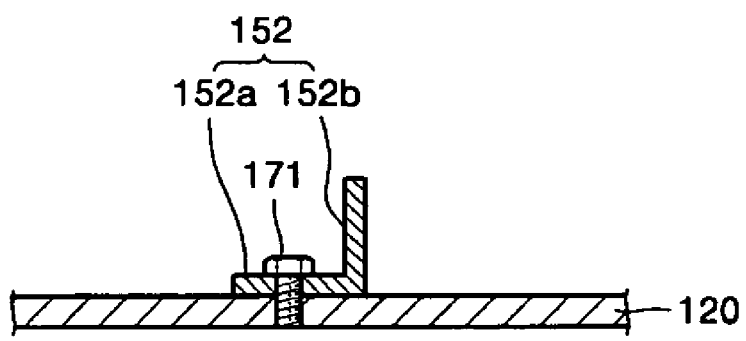
Figure 2C:
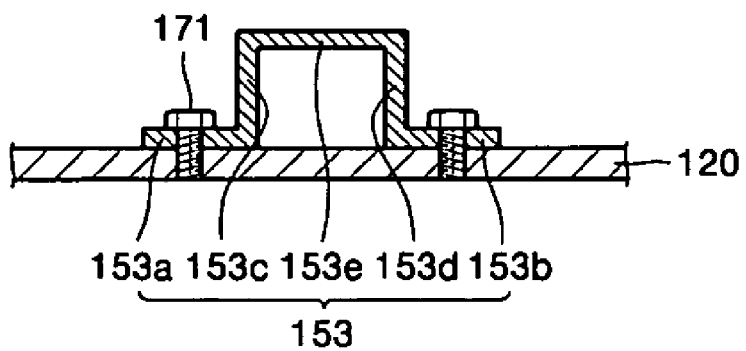

The reinforcing members 150 can be formed in various structures as shown in FIGS. 2A through 2C. In one embodiment, as shown in FIG. 2A, the reinforcing member 151 includes i) a base portion 151a formed as a plate and coupled to the chassis base 120 by a screw 171, ii) a connection portion 151b extending from the base portion 151a toward the rear portion, and iii) a protruding unit 151c bent from the connection portion 151b to be apart from the base portion 151a. In another embodiment, as shown in FIG. 2B, the reinforcing member 152 can include i) a base portion 152a formed as a plate and coupled to the chassis base 120 by the screw 171, and ii) an extension portion 152b extending from the base portion 152a toward the rear portion. In still another embodiment, as shown in FIG. 2C, the reinforcing member 153 can include i) a first base portion 153a and a second base portion 153b that are formed as plates and coupled to the chassis base 120 by screws 171, ii) a first connection portion 153c and a second connection portion 153d extending from facing edges of the first and second base portions 153a and 153b toward the rear portions and iii) a protrusion portion 153e formed by bending from edges of the first and second connection portions 153c and 153d.

The reinforcing members 151-153 having the above structures are disposed at appropriate positions for supporting the chassis base 120. Referring to FIGS. 2A and 2C, the reinforcing members 151 and 153 including the protrusion portions 151c and 153e can be disposed adjacent to a lower edge of the chassis base 120 so that the devices 134 mounted on the signal transmission members 133 can be supported by the protrusion portions as shown in FIG. 1.

Figure 3:
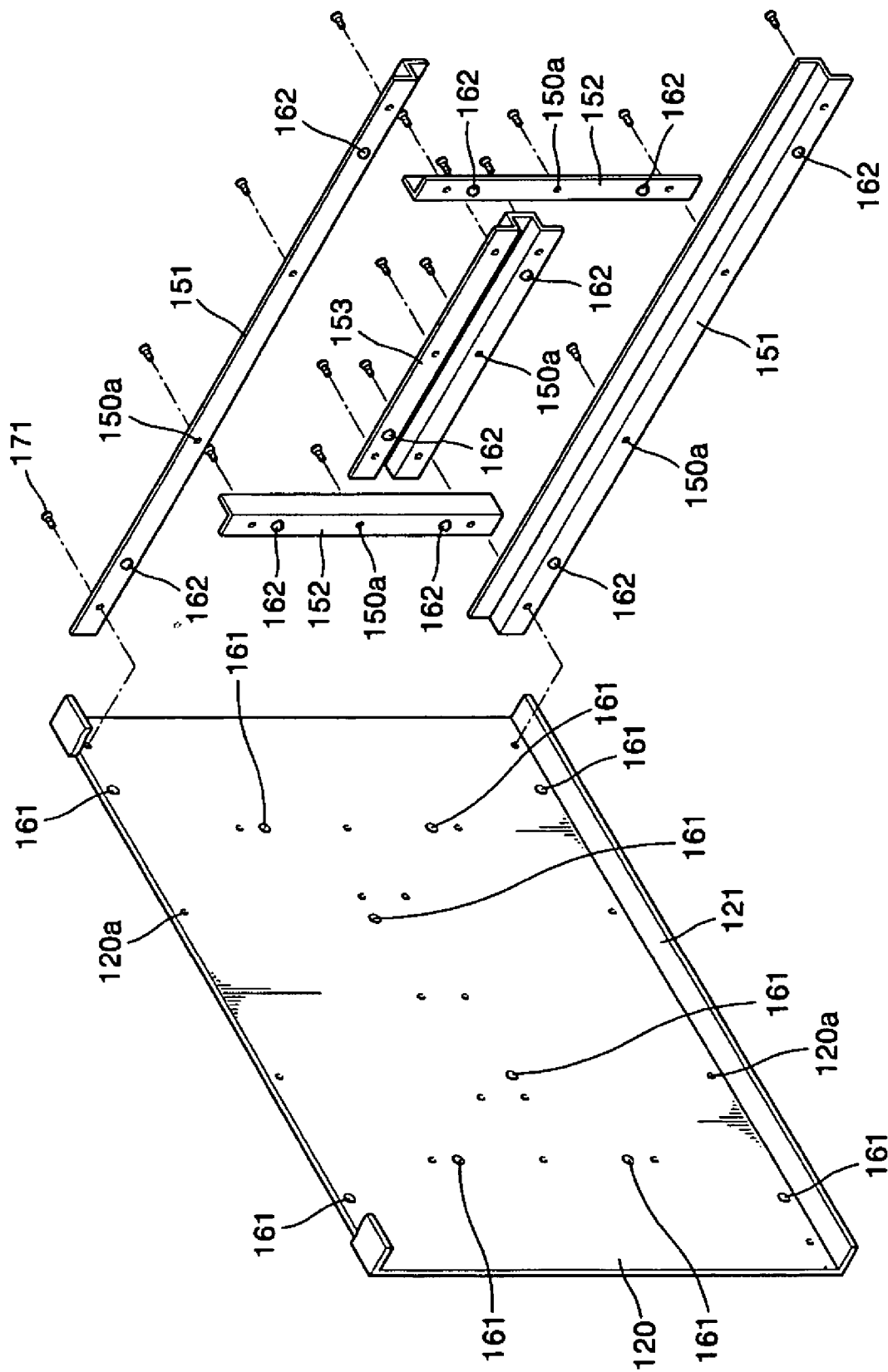
FIG. 3 is an exploded perspective view of the plasma display apparatus before the reinforcing members are coupled to the chassis base of FIG. 1.

In addition, the reinforcing members 151-153 having various structures are aligned by an aligning unit according to an embodiment of the present invention as shown in FIG. 3. After that, the screws 171 penetrating coupling holes 150a of the reinforcing members 151-153 are coupled to screw recesses 120a formed on the chassis base 120, and accordingly, the reinforcing members 151-153 are coupled to the chassis base 120 (see FIG. 3). That is, the aligning unit aligns the reinforcing members 151-153 at exact positions before they are coupled to the chassis base 120, and thus, inexact coupling of the reinforcing members 151-153 to the chassis base 120 can be prevented. In addition, interferences between the reinforcing members and the printed circuit boards 131 generated due to the inexact coupling can be prevented in advance. In one embodiment, the aligning unit can include two or more aligning recesses 161 separated from each other on the chassis base 120 to correspond to the positions where the reinforcing members 151-153 will be installed, and aligning protrusions 162 protruding from the reinforcing members 151-153 toward the chassis base 120 so as to be inserted into the aligning recesses 161. In another embodiment, the aligning unit can include at least one aligning recess 161 and at least one aligning protrusion 162. In one embodiment, the aligning recesses 161 can be formed on the reinforcing members 151-153, and the aligning protrusions 162 can be formed on the chassis base 120. In addition, positions where the reinforcing members 151-153 will be installed are not limited to the above examples.

Figure 4:
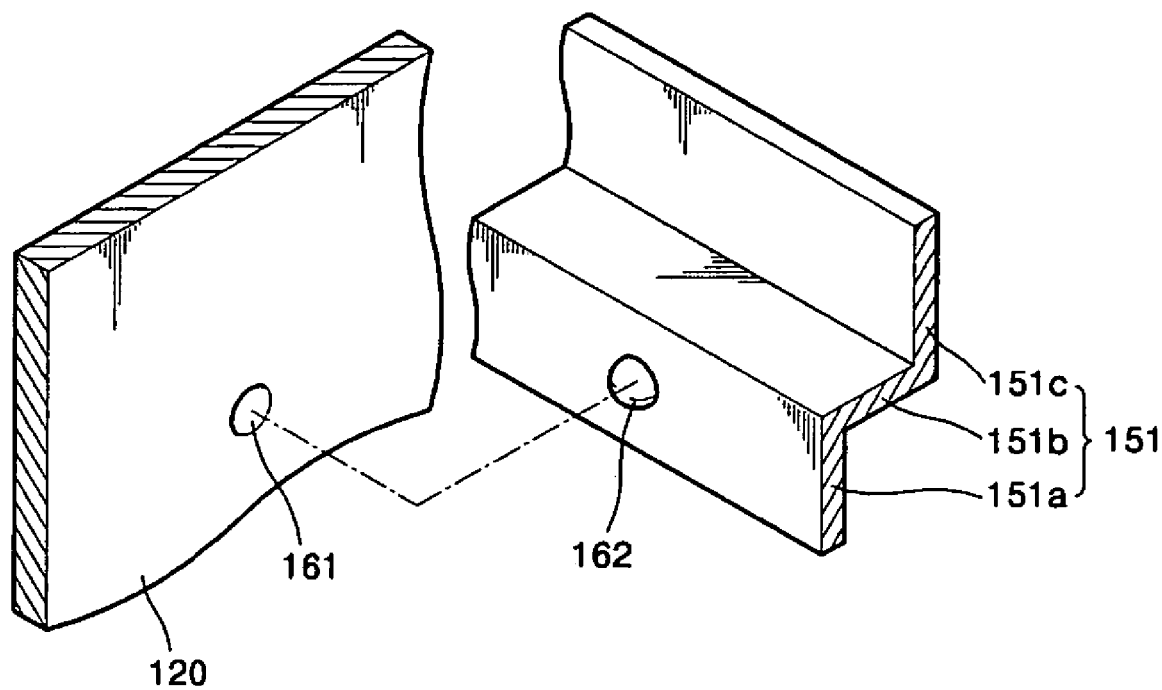
FIG. 4 is an exploded perspective view of examples of an aligning protrusion and an aligning recess for aligning the reinforcing members and the chassis base shown in FIG. 3.
Figure 5:
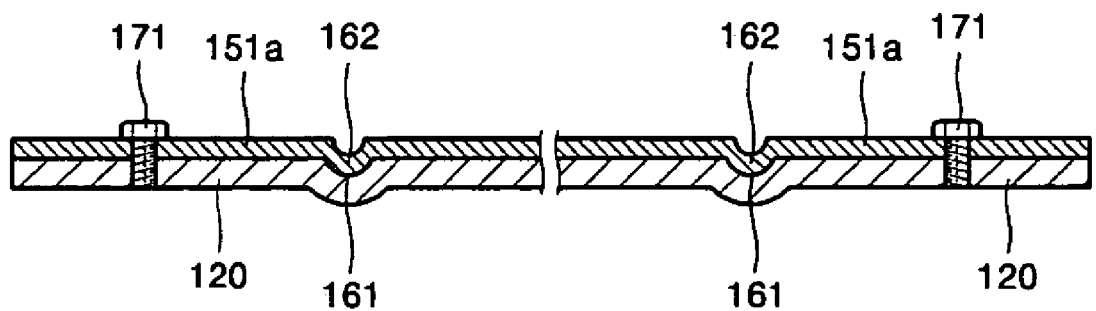
FIG. 5 is a cross-sectional view of the plasma display apparatus after the reinforcing members and the chassis base shown in FIG. 4 are coupled to each other.

In one embodiment, as shown in FIGS. 4 and 5, the aligning recess 161 is formed concavely on the rear surface of the chassis base 120 in a hemisphere shape. In one embodiment, the aligning protrusion 162 protrudes as a hemisphere from the surface of the reinforcing member 151 coupled to the chassis base 120, that is, the front surface of the base portion 151a shown in FIG. 4, so as to be inserted into the aligning recess 161. In one embodiment, the shape of the aligning recess and protrusions 161 and 162 are not limited to a hemisphere shape, and may have other shapes as long as they can facilitate the alignment process. In one embodiment, the aligning recess 161 is formed via an embossing process, and the opposite surface thereof can protrude. In another embodiment, the aligning protrusion 162 can be formed in the embossing process. However, forming of the aligning protrusion is not limited to the above method and the protrusion can be also convexly formed.

In one embodiment, the aligning protrusions 161 (not shown in FIG. 2B) are formed on the base portion 152a of the reinforcing member 152 shown in FIG. 2B. In another embodiment, in case of the reinforcing member 153 shown in FIG. 2C, the aligning protrusions 161 (not shown in FIG. 2C) can be formed on the first and second base portions 153a and 153b, or can be only formed on the first base portion 153a or on the second base portion 153b.

As described above, the aligning protrusions 162 formed on the reinforcing members 151-153 coupled to the chassis base 120 are inserted into the aligning recesses 161 formed in the positions where the reinforcing members 151-153 will be installed. Thus, the reinforcing members 151-153 can be preliminarily coupled to the chassis base 120. Therefore, the reinforcing members 151-153 can be aligned by moving them to left and right or up and down directions precisely and rapidly. Accordingly, inexact coupling between the reinforcing members 151-153 and the chassis base 120 can be prevented. Furthermore, the interferences of the reinforcing members 151, 152, and 153 with the printed circuit boards 131 generated due to the inexact coupling operation can be prevented in advance.

Figure 6:
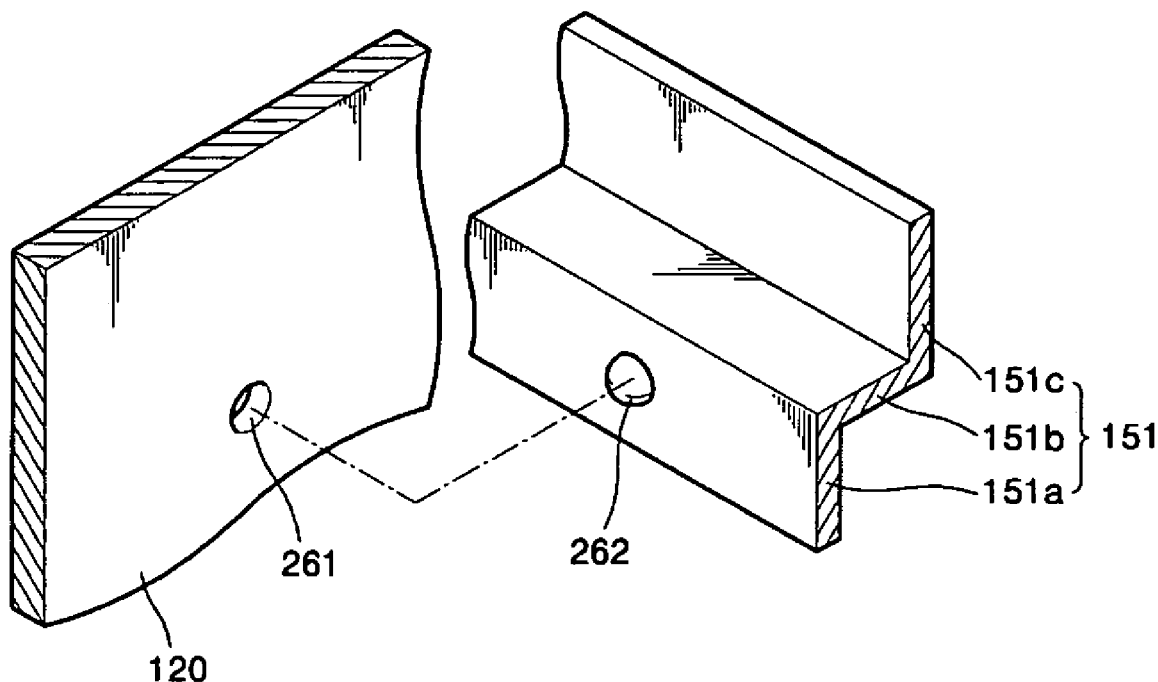
FIGS. 6 and 8 are exploded perspective views of other examples of the aligning protrusion and the aligning recess for aligning the reinforcing member and the chassis base of FIG. 3.
Figure 7:
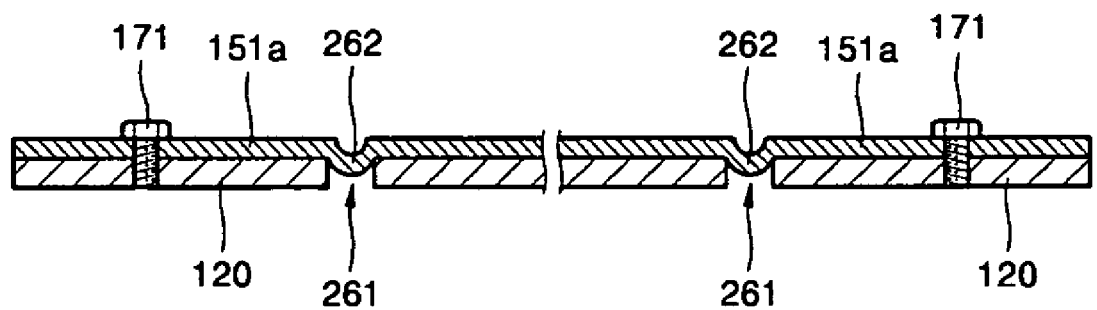
FIG. 7 is a cross-sectional view of the plasma display apparatus after the reinforcing member and the chassis base shown in FIG. 6 are coupled to each other.
Figure 8:
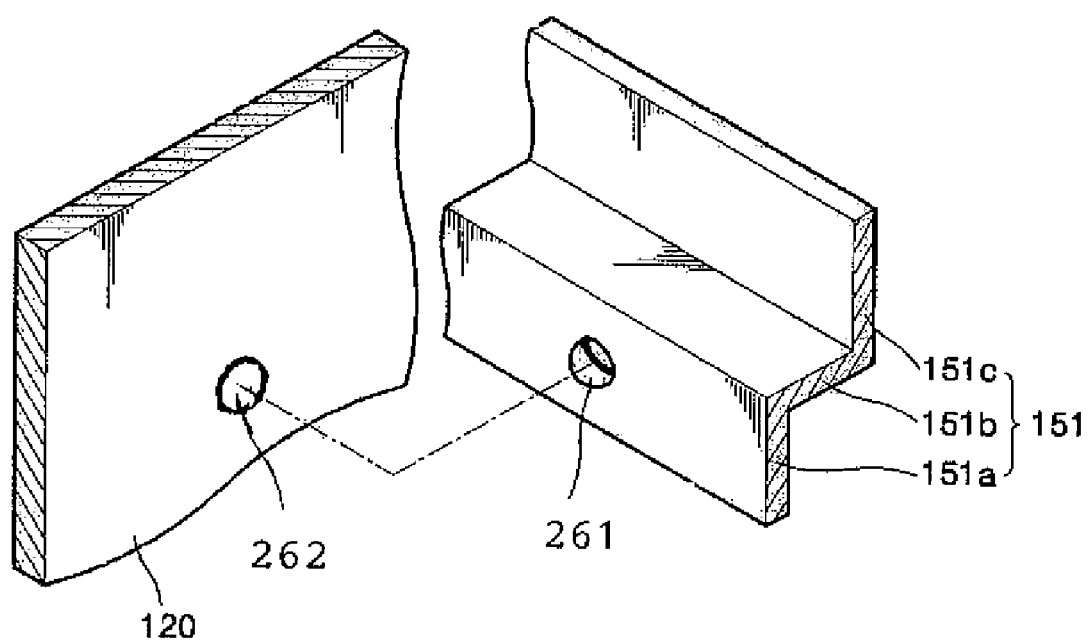

In addition, the aligning recesses 261 and aligning protrusions 262 can be formed in the structures shown in FIGS. 6-8. In one embodiment, as shown in FIGS. 6-8, the aligning recess 261 is formed as a through hole penetrating the chassis base 120, and the aligning protrusions 262 are formed in hemisphere shapes so as to be inserted into the aligning recesses 261 that are formed as through holes. In one embodiment, the aligning recesses 261 can be formed in a piercing process, and the aligning protrusions 262 can be formed in the embossing process so that the opposite surface of the protrusion is concave. However, forming of the aligning protrusion is not limited to the above method and the protrusion can be also convexly formed.

According to embodiments of the present invention, the unit for aligning the reinforcing members is disposed between the reinforcing members and the chassis base, and thus, the reinforcing members can be aligned at exact positions before being coupled to the chassis base. Accordingly, the reinforcing members can be coupled to the chassis base precisely, and the interferences of the reinforcing members with the printed circuit boards generated due to the inexact coupling can be prevented in advance.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

What is claimed is:

1. A plasma display apparatus, comprising:
   a plasma display panel configured to display images;
   a chassis base disposed on a rear portion of the plasma display panel;
   a circuit unit disposed on a rear portion of the chassis base to drive the plasma display panel; and
   at least one reinforcing member coupled to a rear surface of the chassis base,
   wherein a plurality of aligning recesses that are separated from each other are formed in one of the chassis base and the reinforcing member, and a plurality of aligning protrusions to be inserted into the aligning recesses are formed on the other of the chassis base and the reinforcing member, and wherein the plurality of aligning protrusions extend toward or face away from the plasma display panel and in a direction substantially perpendicular to the rear surface of the chassis base.

2. The apparatus of claim 1, wherein at least one of the aligning recesses has a closed inner surface.

3. The apparatus of claim 2, wherein each of the aligning recesses is formed by an embossing process, and an opposite surface thereof is protruded.

4. The apparatus of claim 1, wherein at least one of the aligning recesses includes a through hole.

5. The apparatus of claim 1, wherein each of the aligning protrusions is formed by the embossing process, and the opposite side thereof is convex.

6. The apparatus of claim 1, wherein the reinforcing member includes a base portion formed as a plate parallel to the chassis base so as to be coupled to the chassis base, and an extension portion bent backward from the base portion, wherein the base portion has the aligning recesses or the aligning protrusions formed on a surface facing the chassis base.

7. The apparatus of claim 1, wherein the reinforcing member includes a base portion formed as a plate parallel to the chassis base so as to be coupled to the chassis base, a connection portion bent backward from the base portion, and a protrusion portion bent from the connection portion to be apart from the base portion and extending parallel to the chassis base, wherein the base portion has the aligning recesses or the aligning protrusions formed on a surface facing the chassis base.

8. The apparatus of claim 1, wherein the reinforcing member includes a first base portion and a second base portion formed as plates parallel to the chassis base so as to be coupled to the chassis base and separated from each other, a first connection portion and a second connection portion bent backward from facing edges of the first and second base portions, and a protrusion portion extending from edges of the first and second connection portions, wherein the aligning recesses or the aligning protrusions are formed on a surface of at least one of the first and second base portions facing the chassis base.

9. A plasma display apparatus, comprising:
   a chassis base, comprising first and second surfaces opposing each other, configured to support a plasma display panel via the first surface; and
   at least one reinforcing member coupled to the second surface of the chassis base,
   wherein at least one aligning recess is formed in one of the chassis base and the reinforcing member, and at least one aligning protrusion to be inserted into the at least one aligning recess is formed on the other of the chassis base and the reinforcing member, and wherein the at least one aligning protrusion extends toward or faces away from the plasma display panel and in a direction substantially perpendicular to the rear surface of the chassis base.

10. A plasma display apparatus, comprising:
    a chassis base, comprising first and second surfaces opposing each other, configured to support a plasma display panel via the first surface; and
    a plurality of reinforcing members coupled to the second surface of the chassis base, wherein at least two of the plurality of reinforcing members are substantially perpendicular to each other,
    wherein at least one aligning recess is formed in one of the chassis base and the reinforcing member, and at least one aligning protrusion to be inserted into the at least one aligning recess is formed on the other of the chassis base and the reinforcing member, and wherein the at least one aligning protrusion extends toward or faces away from the plasma display panel.

11. The apparatus of claim 10, wherein at least one of the plurality of reinforcing members is different in length from the remaining reinforcing members.

12. The apparatus of claim 10, wherein the at least one aligning recess is formed only in one of the chassis base and the plurality of reinforcing members, and the at least one aligning protrusion is formed only on the other of the chassis base and the plurality of reinforcing members.

* * * * *